United States Patent
Katano

(10) Patent No.: US 8,920,190 B2
(45) Date of Patent: Dec. 30, 2014

(54) ELECTRONIC DEVICE, CONNECTION STRUCTURE OF ELECTRONIC DEVICE, AND ELECTRONIC APPARATUS

(71) Applicant: Fujitsu Limited, Kawasaki (JP)

(72) Inventor: Katsuhisa Katano, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/966,419

(22) Filed: Aug. 14, 2013

(65) Prior Publication Data
US 2014/0051272 A1  Feb. 20, 2014

(30) Foreign Application Priority Data

Aug. 20, 2012 (JP) .................. 2012-181350

(51) Int. Cl.
 H01R 31/08 (2006.01)
 H01R 25/16 (2006.01)
 H01R 13/629 (2006.01)
 H05K 7/14 (2006.01)

(52) U.S. Cl.
 CPC ........ H01R 25/162 (2013.01); H01R 13/62905 (2013.01); H05K 7/1454 (2013.01); *Y10S 439/9281* (2013.01)
 USPC .......................... 439/507; 439/928.1; 439/377

(58) Field of Classification Search
 USPC ......... 439/61, 266, 267, 507, 928, 928.1, 377
 See application file for complete search history.

(56) References Cited

U.S. PATENT DOCUMENTS

| 4,401,351 A | * | 8/1983 | Record .......................... 439/61 |
| 4,558,914 A | * | 12/1985 | Prager et al. .................. 439/928 |
| 5,249,979 A | * | 10/1993 | Deinhardt et al. ............ 439/928 |
| 5,564,802 A | * | 10/1996 | Chiou .......................... 439/928 |

FOREIGN PATENT DOCUMENTS

| JP | 11-261264 | 9/1999 |
| JP | 2003-224871 | 8/2003 |

* cited by examiner

*Primary Examiner* — Tho D Ta
(74) *Attorney, Agent, or Firm* — Staas & Halsey LLP

(57) ABSTRACT

An electronic device movable in an insertion direction into a supporting member, in a state of being stacked on another electronic device, includes a first connector urged in a direction same as a removal direction in which the electronic device is removed from the supporting member, a housing that includes a connector housing and a guide for moving the first connector in the insertion direction or the removal direction, a second connector disposed at a position connectable to the first connector of the another electronic device, a holding member that causes the first connector to switch between a protruded and a retreated states with respect to the connector housing, and a guide rail that changes a position of the first connector in a placing direction in accordance with a position of the first connector in the insertion direction and the removal direction.

7 Claims, 19 Drawing Sheets

ELECTRONIC DEVICE, CONNECTION STRUCTURE OF ELECTRONIC DEVICE, AND ELECTRONIC APPARATUS

CROSS-REFERENCE TO RELATED APPLICATION

This application is based upon and claims the benefit of priority of the prior Japanese Patent Application No. 2012-181350, filed on Aug. 20, 2012, the entire contents of which are incorporated herein by reference.

FIELD

The embodiment discussed herein is related to an electronic device, a connection structure of the electronic device, and an electronic apparatus.

BACKGROUND

Electronic devices, such as enclosures, are used by being installed in a supporting member, such as a rack or a locker. For example, signal wires and power wires between the electronic devices are generally connected by cable connection using a backboard or by connection using a rear connector board. This makes it possible to increase the functions of the electronic devices. As a proposal for such a connection, the proposal discussed in Japanese Laid-open Patent Publication No. 11-261264 is known.

SUMMARY

According to an aspect of the invention, an electronic device available to be moved in an insertion direction into a supporting member to be stored in the supporting member in a state of being stacked on another electronic device, the electronic device includes a first connector that is urged by an urging member, when the electronic device is in a state in which the electronic device is supported by the supporting member, in a direction same as a removal direction in which the electronic device is removed from the supporting member; a housing that includes a first plate, a second plate, a connector housing disposed in the first plate, and a guide disposed at the second plate side, the first plate and the second plate being disposed side by side in a placing direction in which the electronic devices are placed one on top of another, the connector housing including the first connector so that the first connector is movable in directions same as an insertion direction and the removal direction, respectively, the insertion direction being in a direction in which the electronic device is inserted into the supporting member, the guide contacting the first connector of another electronic device disposed nearby the electronic device and the guide moving the first connector in the insertion direction or the removal direction; a second connector that is disposed at a position where the second connector is connectable to the first connector of the another electronic device, the first connector facing an interior of the housing from the guide; a holding member that causes the first connector of the electronic device to switch between a protruded state and a retreated state with respect to the connector housing in accordance with a relationship between a position of the housing and a position of the supporting member; and a guide rail that changes a position of the first connector of the electronic device in a placing direction in accordance with a position of the first connector in the connector housing in the insertion direction and the removal direction, the placing direction being a direction in which the electronic device is stored in the supporting member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

The electronic devices, the connection structure of the electronic devices, and the electronic apparatus disclosed in the specification make it possible to facilitate connection between the electronic devices that are installed in the supporting member, such as a rack.

DESCRIPTION OF EMBODIMENT

Preliminary Consideration

In a conventional technology, when an interface connector is used in connecting a plurality of electronic devices that are installed in a rack, it may be difficult to provide installation space thereof. The electronic devices are connected using cables after installing the electronic devices in the rack. Therefore, since, at the locations where the electronic devices are installed, for example, connection of the electronic devices using cables and disposal of excess length portions of the cables are performed, it takes time to set the electronic devices. As a result, it takes time for the electronic devices to become operable.

It is preferable to provide electronic devices, connection structures of the electronic devices, and an electronic apparatus that make it possible to facilitate connection and disconnection of the electronic devices that are installed in a supporting member, such as a rack.

Figure 2:
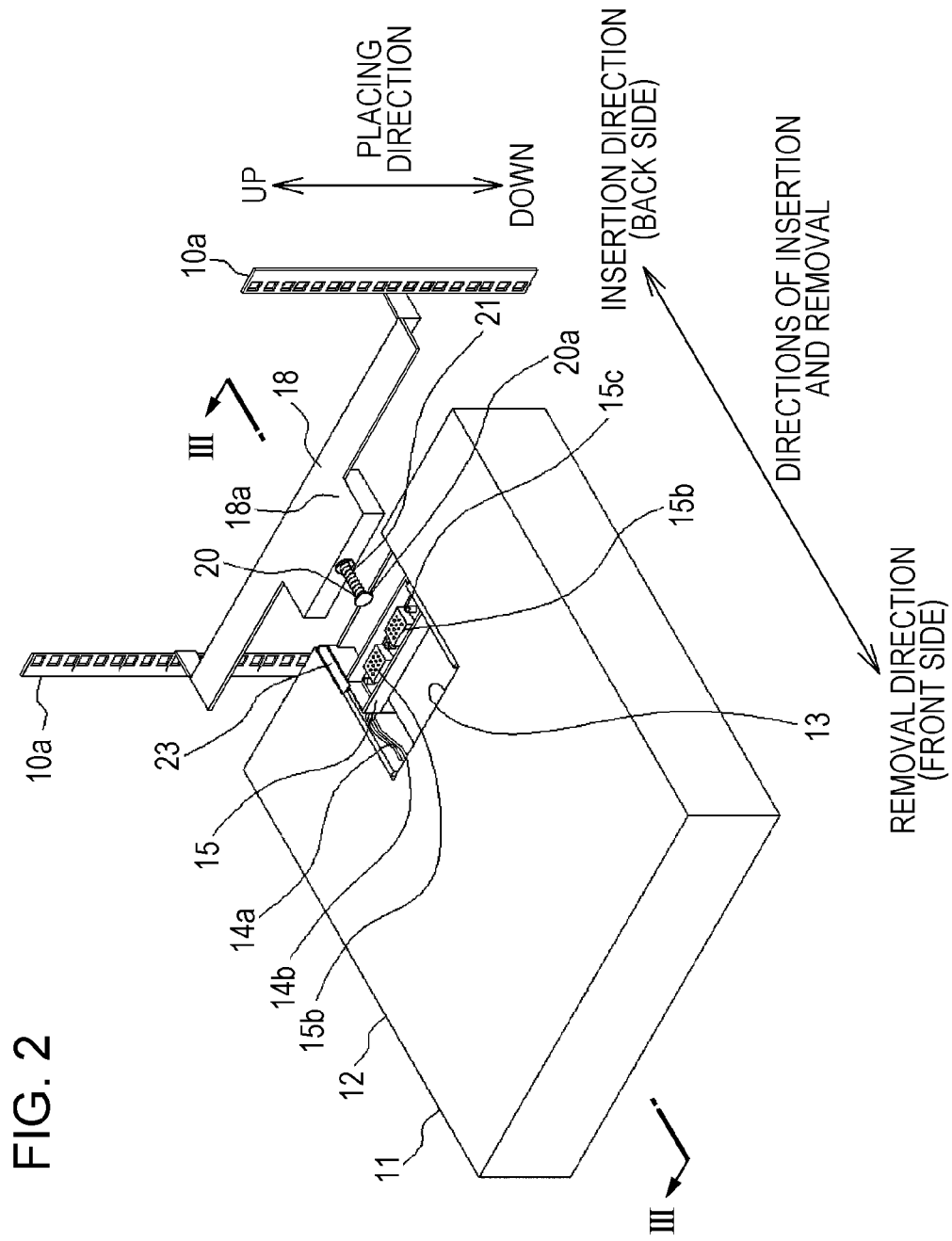
FIG. 2 is a perspective view of one enclosure according to the embodiment, and a protruding portion and a positioning member included in a connection structure of the enclosure.

Hereinafter, an embodiment will be described with reference to the attached drawings. However, in the drawings, the sizes, the proportions, and so forth of parts are sometimes not exactly the same as the actual sizes, proportions, and so forth. In addition, for the sake of easier understanding, some of the structural elements that actually exist may not appear depending upon the figures. Further, in the description below, insertion and removal directions and up-down directions (placing directions) of electronic devices are as indicated in FIG. 2.

Embodiment

Electronic Device and Electronic Apparatus

Figure 1:
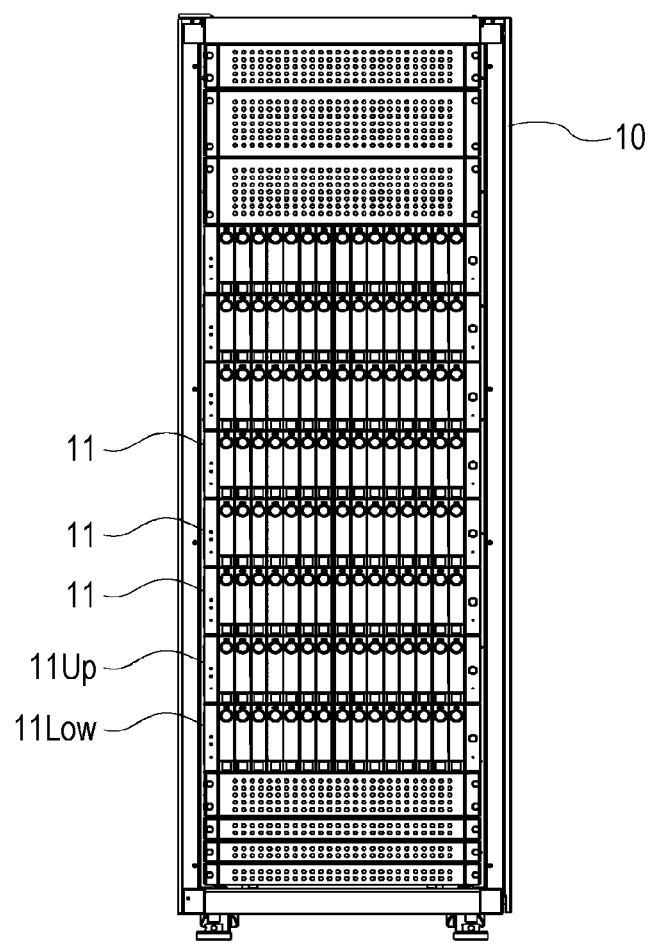
FIG. 1 is a front view of an electronic apparatus including a plurality of electronic devices (enclosures) according to an embodiment.
Figure 3:
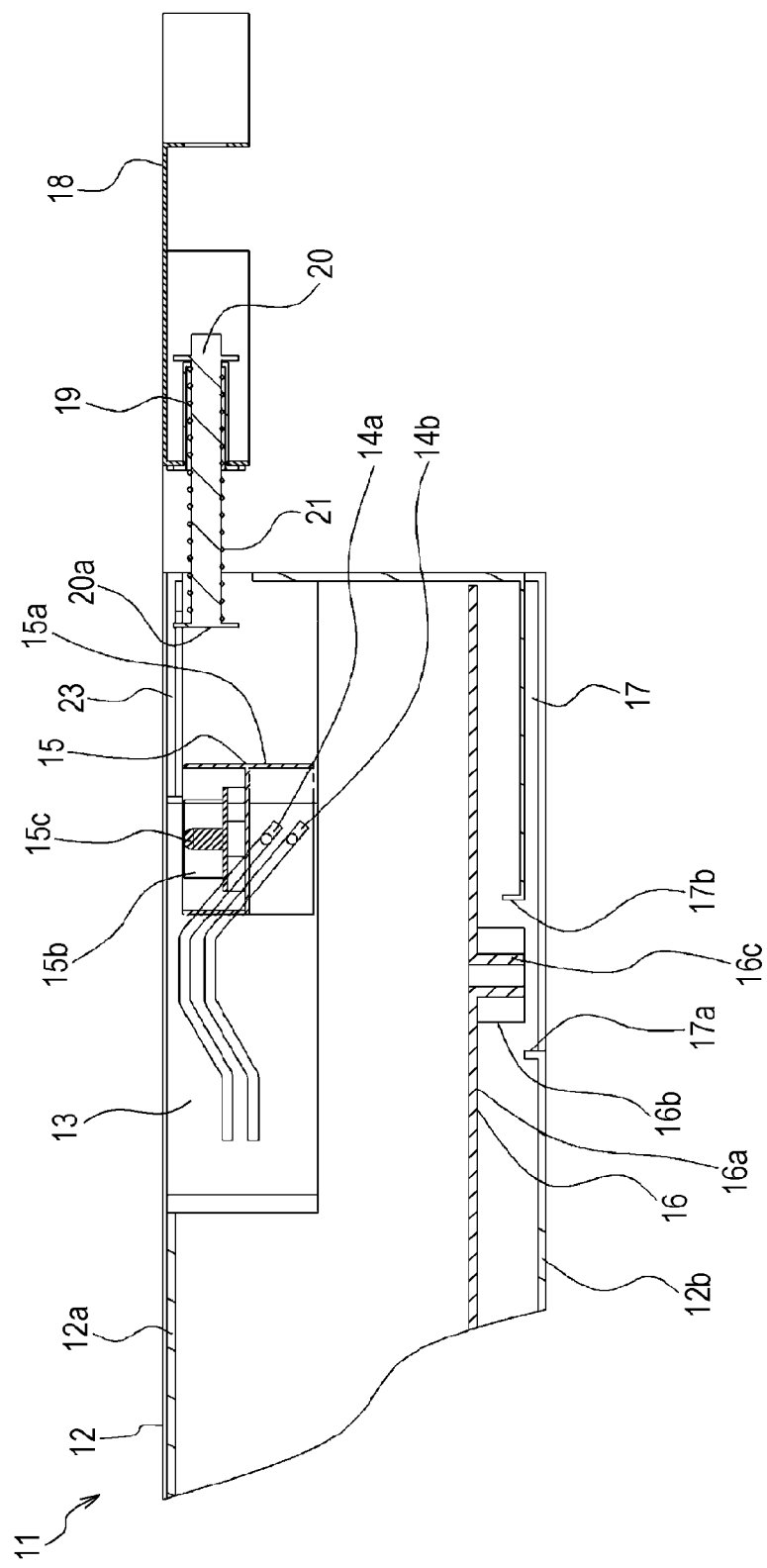
FIG. 3 is a sectional view taken along line III-III in FIG. 2.
Figure 4:
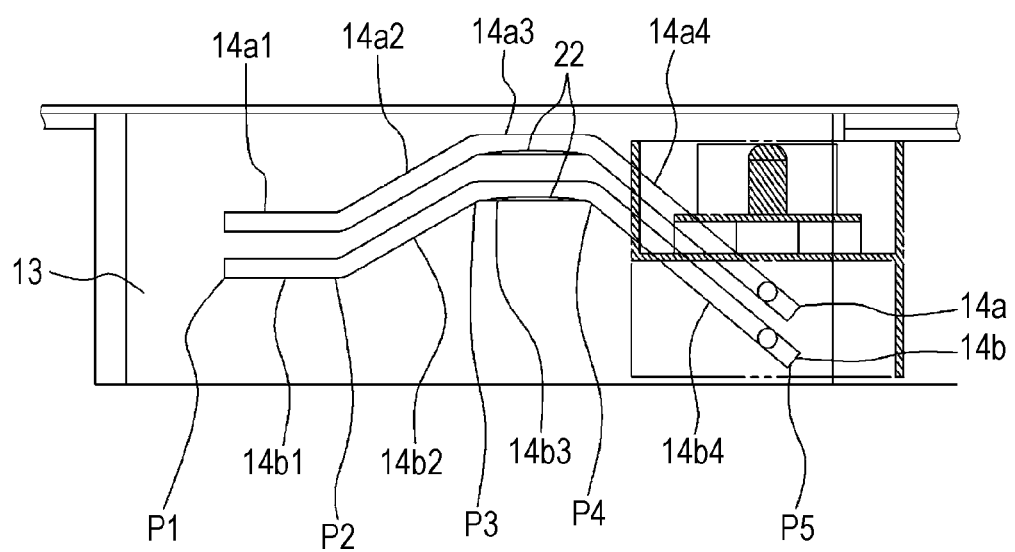
FIG. 4 is an enlarged explanatory view of a portion C in FIG. 3.
Figure 5B:
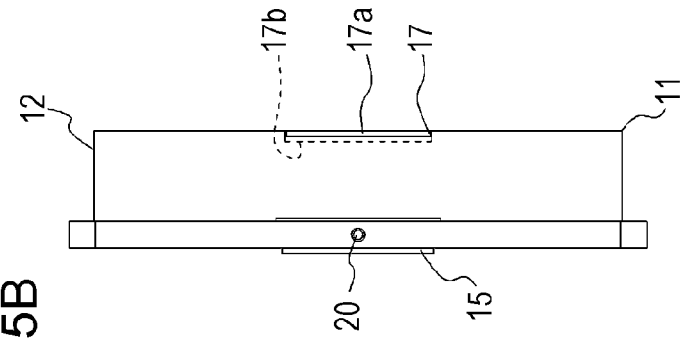
FIGS. 5A to 5C illustrate the enclosure according to the embodiment, and the protruding portion and the positioning member included in the connection structure of the enclosure, with FIG. 5A being a plan view thereof and FIG. 5C being a sectional view taken along line VC-VC in FIG. 5A.
Figure 5A:
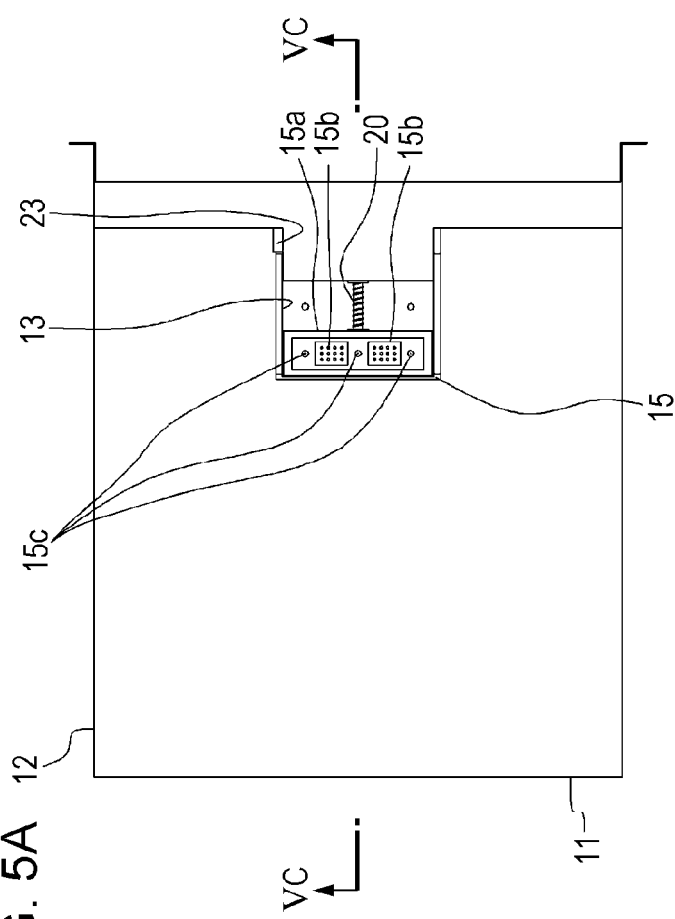
Figure 5C:
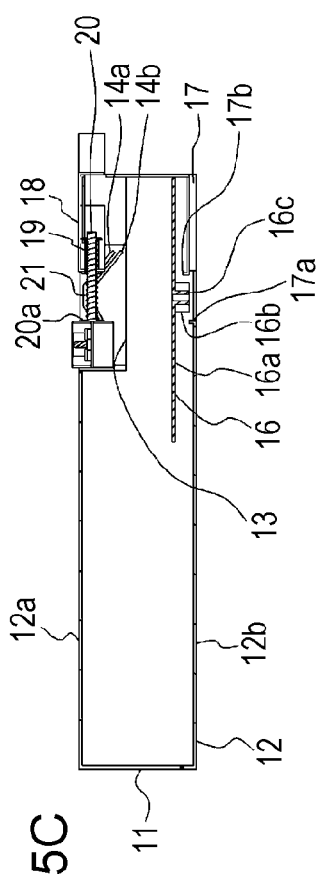
Figure 6:
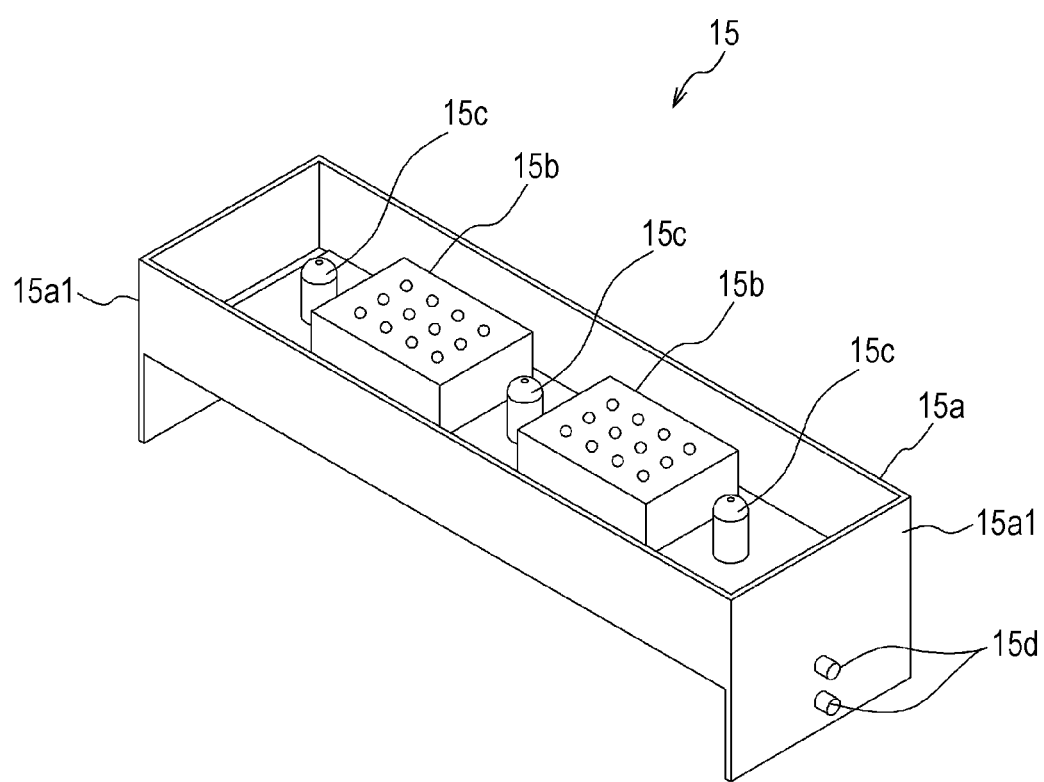
FIG. 6 is a perspective view of a plug connector of the enclosure according to the embodiment.

FIG. 1 is a front view of an electronic apparatus 1 according to the embodiment including a rack 10 in which a plurality of electronic devices (enclosures) 11 are stored. FIG. 2 is a perspective view of one enclosure 11 according to the embodiment, and a protruding portion 18a and a positioning member 20 included in a connection structure of the enclosure 11. FIG. 3 is a sectional view taken along line III-III in FIG. 2. FIG. 4 is an enlarged explanatory view of a portion C in FIG. 3. FIGS. 5A to 5B illustrate the enclosure 11 according to the embodiment, and the protruding portion 18a and the positioning member 20 included in the connection structure of the enclosure, with FIGS. 5A and 5B being a plan view and a side view thereof, respectively, and FIG. 5C being a sectional view taken along line VC-VC in FIG. 5A. FIG. 6 is a perspective view of a plug connector 15 of the enclosure 11 according to the embodiment.

The electronic apparatus 1 according to the embodiment includes the plurality of enclosures 11 that are installed in a rack 10. The rack 10 is an exemplary supporting member, and may be a locker. The enclosures 11 are exemplary electronic devices. An enclosure 11 is moved along the insertion direction thereof into the rack 10. This enclosure 11 and the other enclosures 11 are placed one on top of another in the up-down directions. The upper enclosures 11 according to the embodiment may be connected to or disconnected from the lower enclosures 11. The connection and the disconnection of the upper enclosures 11 and the lower enclosures 11 are automatically performed by insertion and removal of the enclosures 11 into and from the rack 10. In the description below, when the relationship between the upper enclosures 11 and the lower enclosures 11 are to be described, the upper enclosures may be indicated by 11Up and the lower enclosures may be indicated by 11Low. In addition, when the structural elements of the upper enclosures 11 are to be described, these structural elements may be indicated by adding Up to their reference numerals. When the structural elements of the lower enclosures 11 are to be described, these structural elements may be indicated by adding Low to their reference numerals. Although the placing directions of the enclosures 11 is not limited to the up-down directions, the placing directions are described as being in the up-down directions in the embodiment. Therefore, in the embodiment, a first side in the placing direction corresponds to a lower side, and a second side, which is the side opposite to the first side in the placing direction, corresponds to an upper side.

Referring to the drawings, each enclosure 11 includes a housing 12, as illustrated in FIG. 2. As illustrated in FIG. 3, each housing 12 includes a top plate 12a and a bottom plate 12b that are disposed side by side in the placing directions. Each top plate 12a corresponds to a first plate member, and each bottom plate 12b corresponds to a second plate member. Each housing 12 includes a connector accommodating section 13 that is disposed at a back end portion of the top plate 12a in the insertion and removal directions, as illustrated in FIG. 3. Each connector accommodating section 13 accommodates a plug connector 15. Each plug connector 15 corresponds to a first connector. Each plug connector 15 is connected to and disconnected from an associated second connector (described later). Each second connector corresponds to a socket connector 16 that is connected to the plug connector 15. Each first connector may be the socket connector, and each second connector may be the plug connector. As long as the first and second connectors are connectable to each other, they may have any shape and be of any type.

Referring to FIG. 6, the plug connector 15 includes a case 15a. The case 15a includes a contact surface 15a1 with which a contact portion 20a of the positioning member 20 (described later) contacts. Terminals 15b and connecting pins 15c are provided in the case 15a. The connecting pins 15c stabilize the connection between the plug connector 15 and the socket connector 16. Further, guide pins 15d are provided on a side surface of the case 15a.

The plug connector 15 is accommodated in the connector accommodating section 13 so as to be movable in directions that are the same as the insertion and removal directions. When an enclosure 11 is in a state in which it is supported in the rack 10, the plug connector 15 is urged by a coil spring 21 in a direction that is the same as the direction in which the enclosure 11 is removed from the rack 10, as illustrated in FIG. 5A. The coil spring 21 is provided separately from the enclosure 11. The coil spring 21 is an exemplary urging member. Other existing elastic members that are publicly known may be used as the coil spring 21. The coil spring 21, which is provided separately from the enclosure 11, is supported by a base 18 that is provided at support columns 10a of the rack 10. More specifically, the positioning member 20 having the shape of a bar is slidably mounted at the protruding portion 18a of the base 18, with the coil spring 21 being disposed around the positioning member 20. The coil spring 21 urges the positioning member 20. The positioning member 20 includes the contact portion 20a that contacts the contact surface 15a1 of the plug connector 15. The positioning member 20 contributes to the positioning of the plug connector 15 when the contact portion 20a contacts the plug connector 15 and elastic force of the coil spring 21 is exerted.

Each enclosure 11 includes a grooved guide 17 that is provided at a back end portion of the bottom plate 12b of the housing 12, and that extends in the insertion and removal directions. The plug connectors 15Low are engageable with the associated guides 17. The guides 17 contact the plug connectors 15Low of the associated enclosures 11Low that are placed therebelow, and move the plug connectors 15Low in the insertion and removal directions of the enclosures 11. Referring to FIGS. 3 and 5C, the guide 17 includes a front-side contact portion 17a that is provided at a front side in the insertion and removal directions, and a back-side contact portion 17b that is provided at a back side in the insertion and removal directions. The position of the front-side contact portion 17a corresponds to the front-side end portion of the grooved guide 17. The back-side contact portion 17b is positioned in the middle of the grooved guide 17. Therefore, the height of the front-side contact portion 17a and the height of the back-side contact portion 17b differ from each other. That is, the back-side contact portion 17b is positioned towards the inner side of the housing 12 than the front-side end portion 17a is.

Each housing 12 is in a state in which its interior is capable of being connected to the outside through its associated guide 17, more specifically, through a portion between the front-side contact portion 17a and the back-side contact portion 17b. The socket connectors 16 are provided in the interior of the housings 12 so as to be situated at positions that allow them to be connected to the plug connectors 15Low that face the interior of the housings 12 from the associated guides 17, as illustrated in FIG. 5C. The socket connectors 16 correspond to the second connectors 16. Each socket connector 16 includes a terminal 16b and a connection hole 16c that are provided at its associated connector substrate 16a. Each terminal 16b is connected to or is disconnected from the terminals 15b of the associated plug connector 15. Each connection hole 16c is connected to or disconnected from the connecting pins 15c of its associated plug connector 15.

Figure 7A:
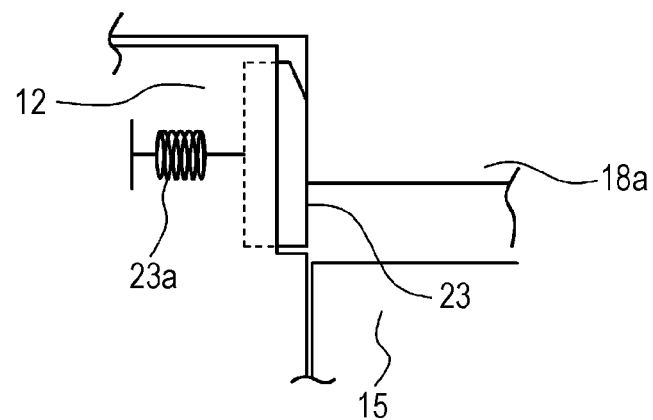
FIG. 7A is an explanatory view of a holding member in a state in which it is accommodated in a housing.
Figure 7B:
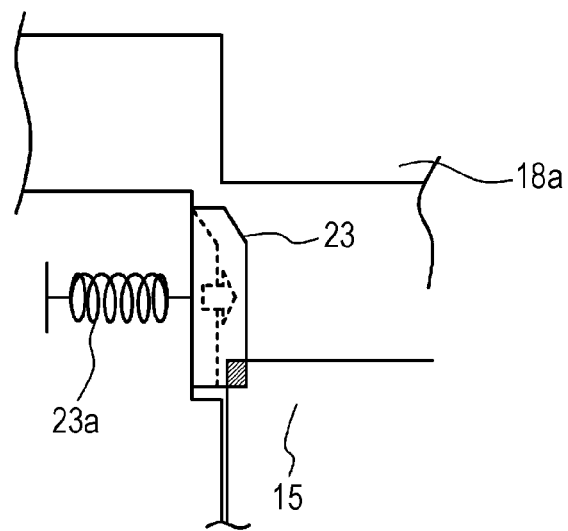
FIG. 7B is an explanatory view of the holding member in a state in which it extends out from the housing.

Referring to FIGS. 7A and 7B, each enclosure 11 includes a holding member 23. In accordance with the positional relationship between the housing 12 and the rack 10, each holding member 23 causes its associated plug connector 15 to switch between a protruded state and a retreated state with respect to the associated connector accommodating section 13. More specifically, in accordance with the positional relationship between the holding members 23 and the protruding portions 18a of the associated bases 18 of the rack 10, the holding members 23 cause the associated plug connectors 15 to switch between the protruded state and the retreated state with respect to the associated connector accommodating sections 13. Each holding member 23 is mounted to its associated housing 12 by being urged towards its associated connector accommodating section 13 by its associated spring member 23a, and is provided so as to be capable of protruding from and retreating into the housing 12. When an enclosure 11 is inserted into the rack 10 and is pushed by the associated protruding portion 18a, the holding member 23 is pushed into and is accommodated in the housing 12. When the holding member 23 is accommodated in the housing 12, the plug connector 15 is capable of being in a state in which it protrudes from the associated connector accommodating section 13. In contrast, as illustrated in FIG. 7B, when the holding member 23 is brought out of the state in which it is pushed by the protruding portion 18a as a result of removing the enclosure 11 from the rack 10, the plug connector 15 extends out at the associated connector accommodating section 13 by urging force of the associated spring member 23a. At this time, when the plug connector 15 is positioned below the associated holding member 23, the protruding of the plug connector 15 is suppressed.

Each enclosure 11 includes guide rails 14a and 14b for the associated plug connector 15. The guide rails 14a and 14b are provided in an inner peripheral side wall of the associated connector accommodating section 13, and engage the guide pins 15d of the associated plug connector 15. The guide rails 14a and 14b change the position of the associated plug connector 15 in the placing directions (up-down directions) in accordance with the position of the plug connector 15 in the associated connector accommodating section 13 in the insertion and removal directions of the associated enclosure 11. Referring to FIG. 4, the guide rail 14a includes a first horizontal portion 14a1, a first inclined portion 14a2, a second horizontal portion 14a3, and a second inclined portion 14a4, which are continuously formed in that order from the front side in the insertion and removal directions (that is, from the side towards which the enclosure 11 is removed). Referring to FIG. 4, the guide rail 14b includes a first horizontal portion 14b1, a first inclined portion 14b2, a second horizontal portion 14a3, and a second inclined portion 14b4, which are continuously formed in that order from the front side in the insertion and removal directions (that is, from the side towards which the enclosure 11 is removed). In the guide rail 14a, the second horizontal portion 14a3 is positioned higher than the first horizontal portion 14a1. In the guide rail 14a, the first inclined portion 14a2 is inclined upward along the insertion direction. The second inclined portion 14a4 is inclined downward along the insertion direction. In the description below, in each guide rail 14a, an end portion of the first horizontal portion 14a1 is called a point P1, a continuous portion between the first horizontal portion 14a1 and the first inclined portion 14a2 is called a point P2, a continuous portion between the first inclined portion 14a2 and the second horizontal portion 14a3 is called a point P3, a continuous portion between the second horizontal portion 14a3 and the second inclined portion 14a4 is called a point P4, and an end portion of the second inclined portion 14a4 is called a point P5. These relationships similarly apply to each guide rail 14b. Plate springs 22 are installed at the second horizontal portions 14a3 and 14b3. When a plug connector 15Low is connected to a socket connector 16Up, the plug connector 15Low is positioned at the second horizontal portions 14a3 and 14b3. Here, the plug connector 15Low is pushed up by the urging force of the spring member 22, and is stably connected.

Next, the connection and disconnection of enclosures 11 as a result of insertion and removal of the enclosures 11 are described.

Figure 8:
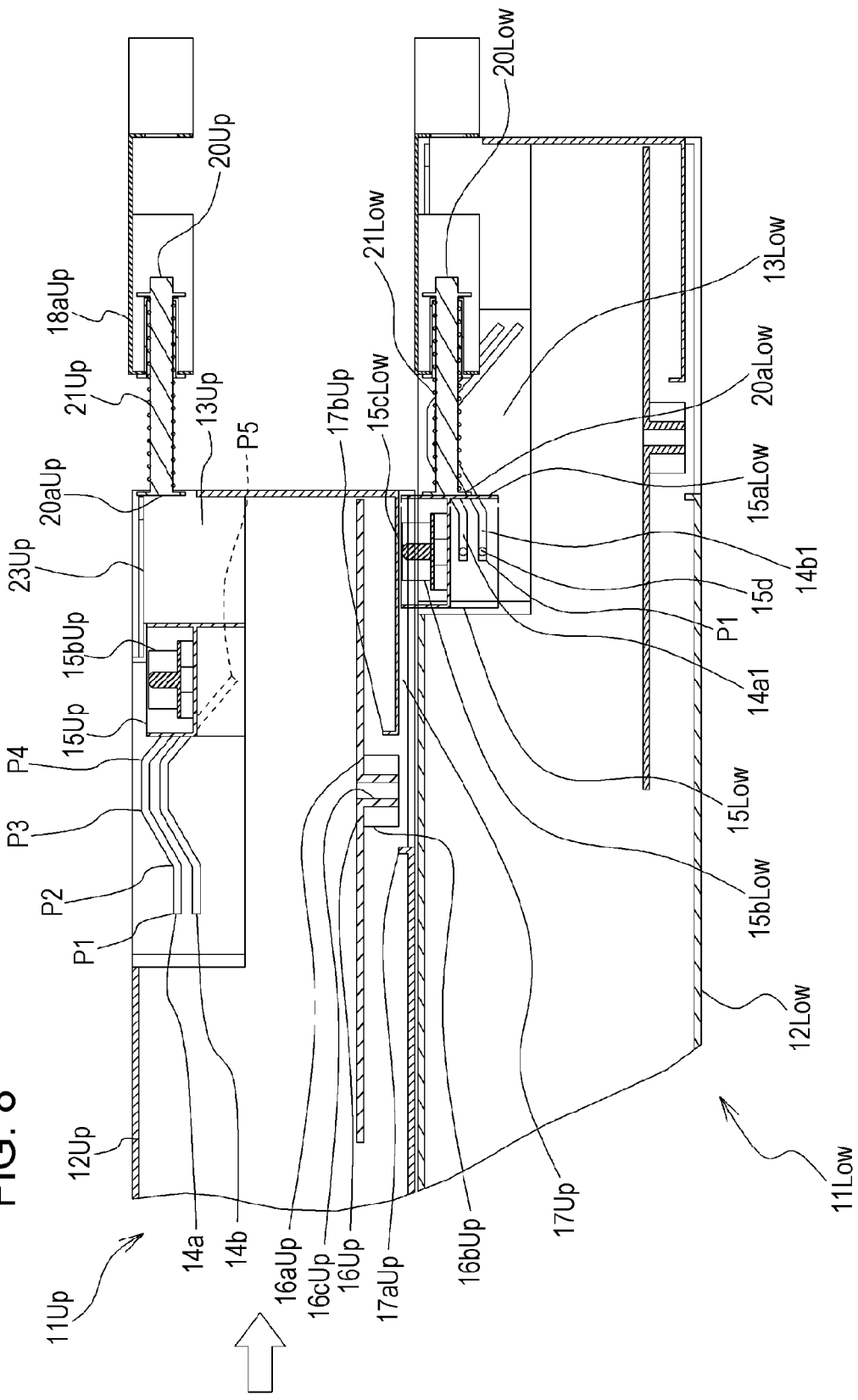
FIG. 8 is an explanatory view of a state directly after insertion of an upper enclosure is started.

When an Enclosure is Further Installed at an Upper Side of an Installed Enclosure First, a case in which an enclosure 11Up is further installed at an upper side of an installed enclosure 11Low in the rack 10 is described. The enclosure 11Low corresponds to another electronic device with regard to the enclosure 11Up. FIG. 8 is an explanatory view of a state in which the enclosure 11Up is being installed in the rack directly after insertion of the enclosure 11Up is started. Referring to FIG. 8, the plug connector 15Up of the enclosure 11Up that is to be installed in the rack 10 is positioned at the point P5, and the plug connector 15Up is accommodated in the connector accommodating section 13Up by the holding member 23Up. Since the holding member 23Up does not contact the protruding portion 18aUp, the holding member 23Up extends out from the housing 12, so that the protruding (upward movement) of the plug connector 15Up is suppressed. In contrast, the plug connector 15Low of the installed enclosure 11Low that is already supported by the rack 10 is moved to the point P1 by the positioning member 20Low and the coil spring 21Low. That is, the plug connector 15Low is brought out from a state in which it is pushed by the holding member 23Low, so that the plug connector 15Low is in a state in which its top portion protrudes slightly from the connector accommodating section 13Low.

The top portion of the plug connector 15Low in such a state passes through the interior of the guide 17Up of the enclosure 11Up as the enclosure 11Up is inserted. Then, the enclosure 11Up is inserted up to a position where the plug connector 15Low contacts the front-side contact portion 17aUp of the guide 17Up. Here, since the back-side contact portion 17bUp is positioned higher than the front-side contact portion 17aUp, the back-side contact portion 17bUp does not contact the top portion of the plug connector 15Low that passes through the interior of the guide 17Up.

Figure 9:
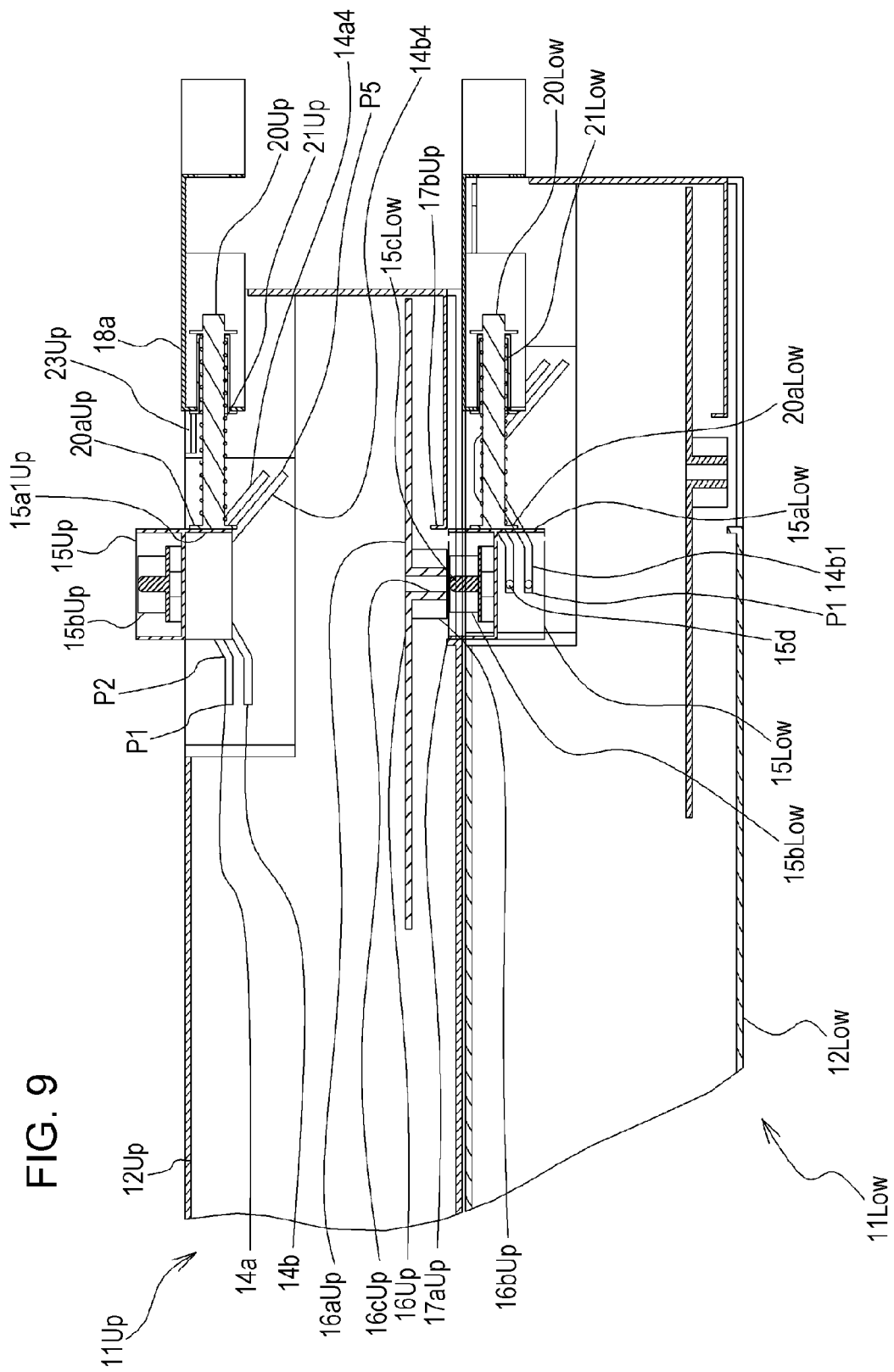
FIG. 9 is an explanatory view of a state at the moment when a front-side contact portion of the upper enclosure contacts a plug connector of a lower enclosure.

Next, FIG. 9 is an explanatory view of a state at the moment when the front-side contact portion 17aUp of the upper enclosure 11Up contacts the plug connector 15Low (contact portion 15a1Low) of the lower enclosure 11Low. When the front-side contact portion 17aUp is caused to be in a state in which it contacts the contact portion 15a1Low of the plug connector 15Low, the position of the plug connector 15Low and the socket connector 16Up are aligned in the insertion and removal directions. Then, when the enclosure 11Up is further inserted to the back side, the plug connector 15Low moves along the first horizontal portions 14a1 and 14b1 while the aforementioned positional relationship is maintained.

When the protruding portion 18a contacts and pushes the holding member 23Up, the holding member 23 is in the retreated state, and the contact portion 20aUp of the positioning member 20 contacts the contact portion 15a1Up. This causes the plug connector 15Up to move along the second inclined portions 14a4 and 14b4 from the point P5.

Figure 10:
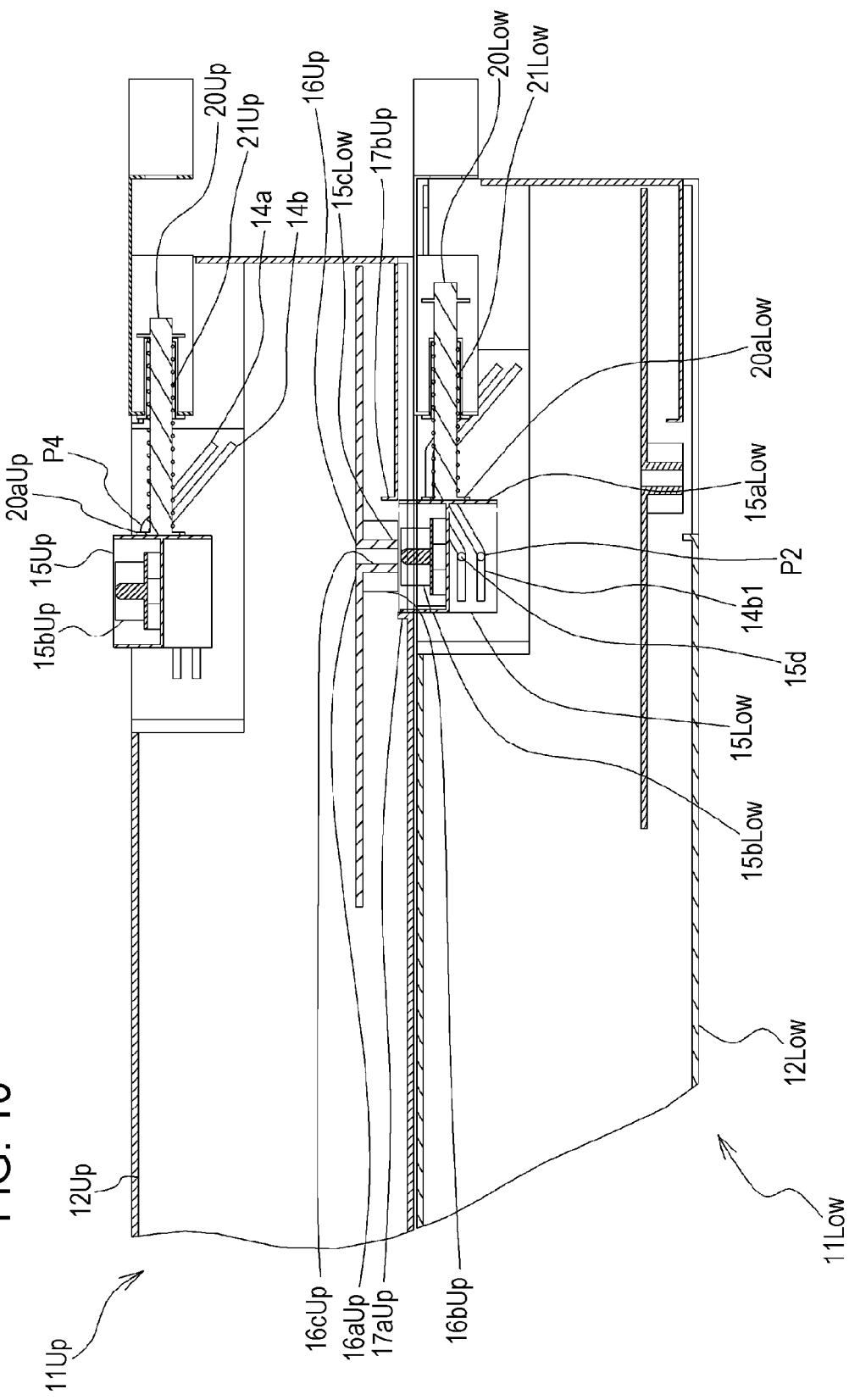
FIG. 10 is an explanatory view of a state when the plug connector of the lower enclosure starts moving upward.

FIG. 10 is an explanatory view of a state when the plug connector 15Low of the lower enclosure 11Low starts moving upward. That is, FIG. 10 illustrates a state in which the plug connector 15Low has reached the point P2. At this time, the plug connector 15Low has not started moving upward, so that the positional relationship between the plug connector 15Low and the socket connector 16Up in the placing directions does not change.

Figure 11:
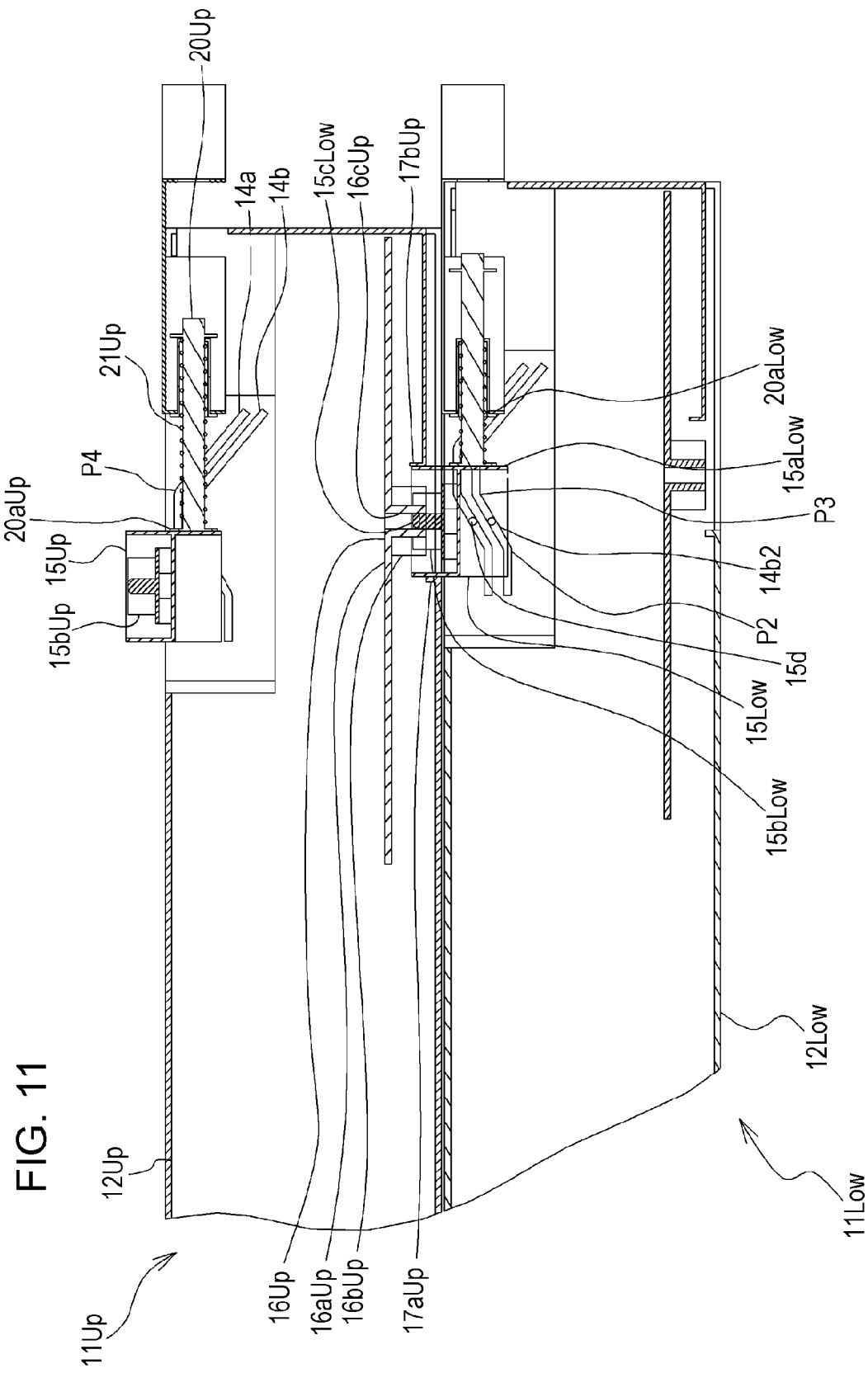
FIG. 11 is an explanatory view of a state when the plug connector of the lower enclosure is fitted to a socket connector of the upper enclosure.

FIG. 11 is an explanatory view of a state when the plug connector 15Low of the lower enclosure 11Low is fitted to the socket connector 16Up of the upper enclosure 11Up. The plug connector 15Low moves upward along the first inclined portions 14a2 and 14b2 by being pushed by the front-side contact portion 17a. That is, the plug connector 15Low moves upward towards the point P3 from the point P2. By this, the fitting of the terminals 15bLow and the terminal 16bUp is started, and the fitting of the connecting pins 15cLow and the connection hole 16cUp is started. At this time, the back-side contact portion 17bUp functions as a guide for the plug connector 15Low that moves upward. The plug connector 15Low and the socket connector 16Up may both be tapered so that they are capable of being easily fitted to each other. The plug connector 15Up of the upper enclosure 11Up is continuously urged by the positioning member 20, so that forward movement of the plug connector 15Up is continued.

Figure 12:
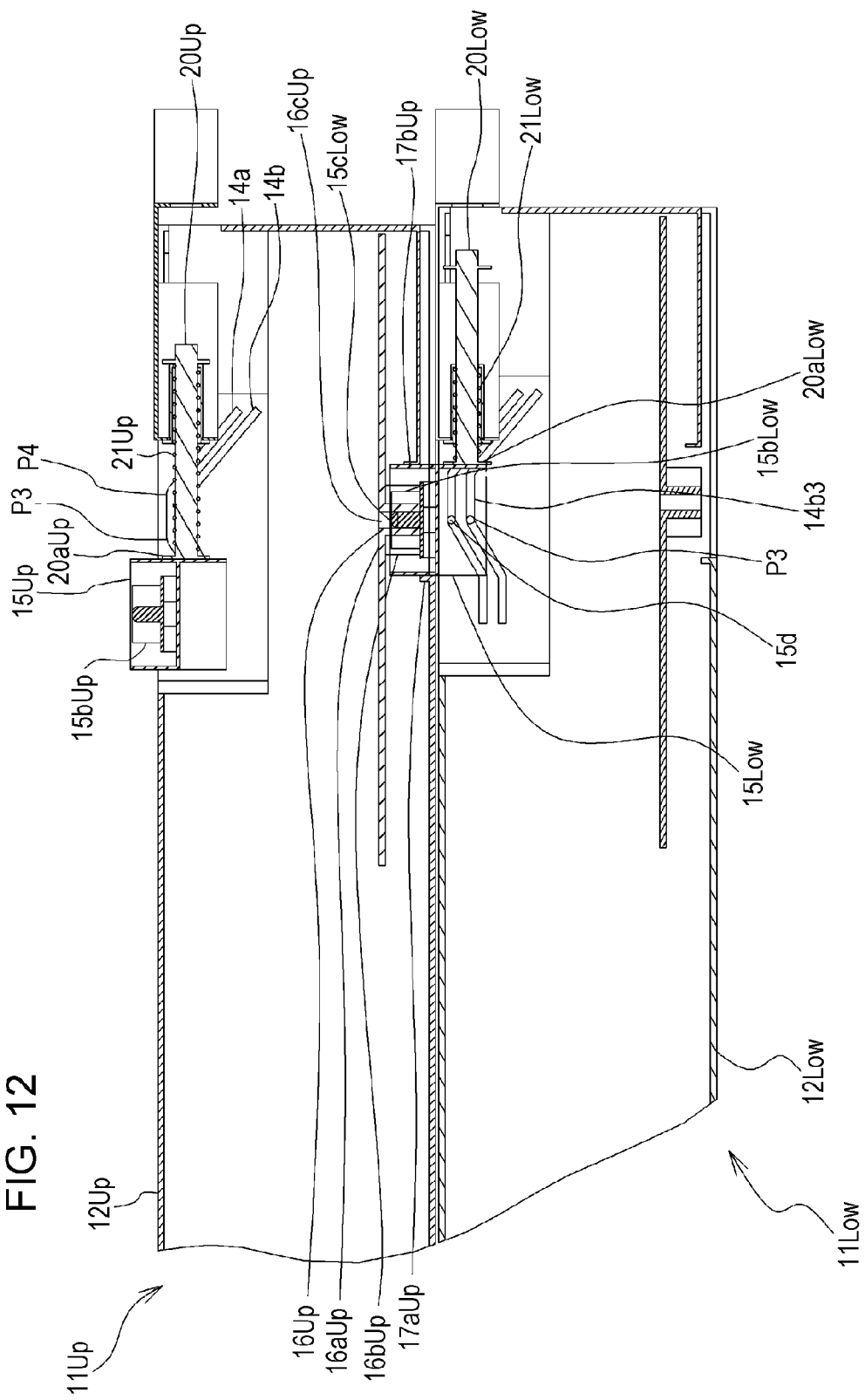
FIG. 12 is an explanatory view of a state when connection of the socket connector and the plug connector as a result of installing the enclosure in the rack has been completed.

FIG. 12 is an explanatory view of a state when connection of the socket connector 16Up and the plug connector 15Low has been completed. The plug connector 15Low reaches the point P3 by being pushed by the front-side contact portion 17a. At this time, the fitting of the socket connector 16Up and the plug connector 15Low to each other is completed.

Figure 13:
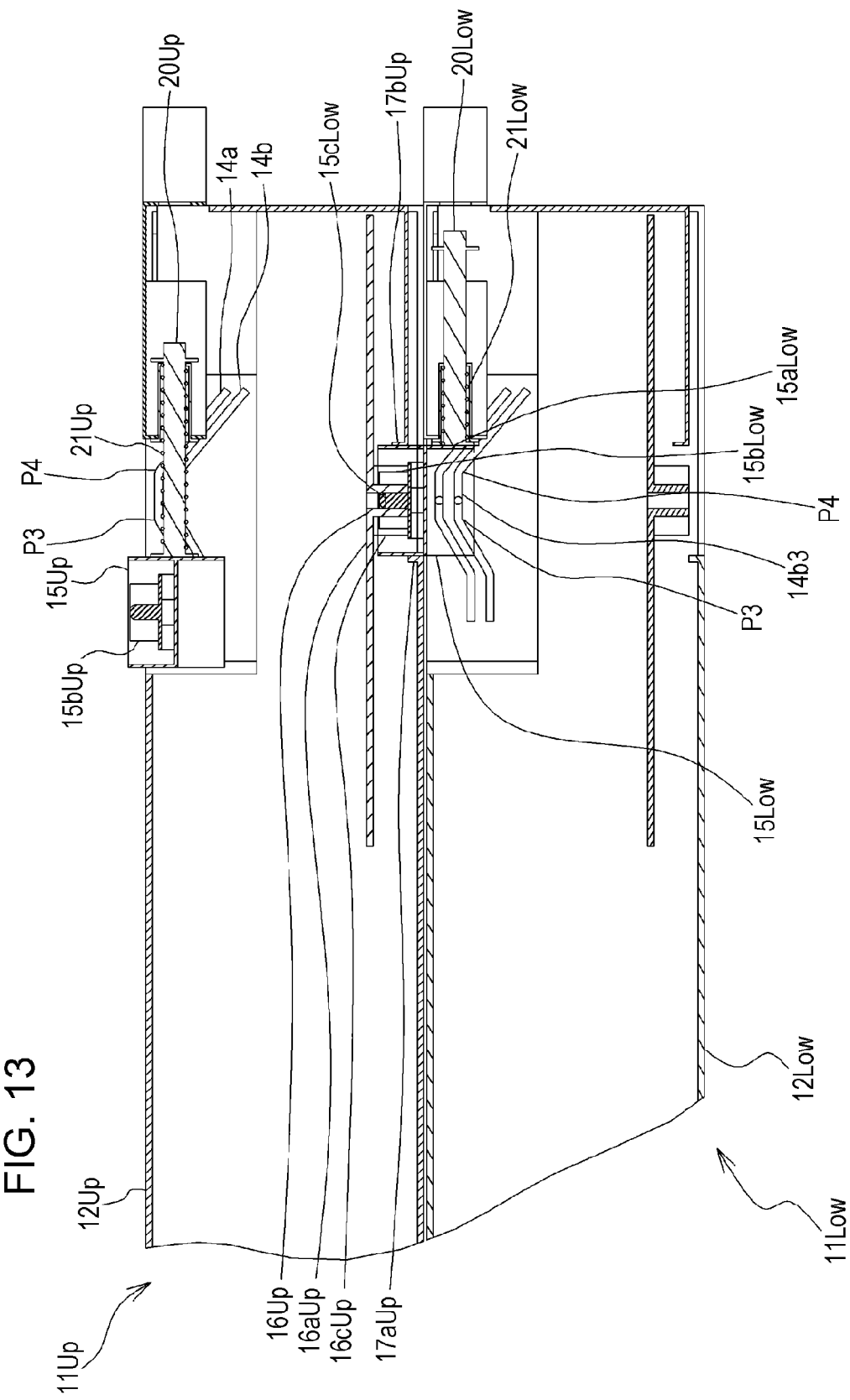
FIG. 13 is an explanatory view of a state when connection of the upper and lower enclosures as result of installing the enclosure in the rack has been completed.

FIG. 13 is an explanatory view of a state when connection of the upper enclosure 11Up and the lower enclosure 11Low has been completed. The plug connector 15Low moves along the second horizontal portions 14a3 and 14b3 by being pushed by the front-side contact portion 17a. This causes the connection between the enclosure 11Up and the enclosure 11Low to be completed. At this time, since the plug connector 15Low is urged towards the socket connector 16Up by the plate springs 22 that are provided at the associated second horizontal portions 14a3 and 14b3, the fitting dimension between the plug connector 15Low and the socket connector 16Up is adjusted. This makes it possible to achieve a stable, firm connection state between the enclosure 11Up and the enclosure 11Low.

The inserted enclosure 11Up may be fixed to the support columns 10a using, for example, screws. The inserted enclosure 11Up is in the same state as the enclosure 11Low illustrated in FIG. 8, and is in a state that allows an enclosure 11 to be placed at the upper side of the inserted enclosure 11Up.

Figure 14:
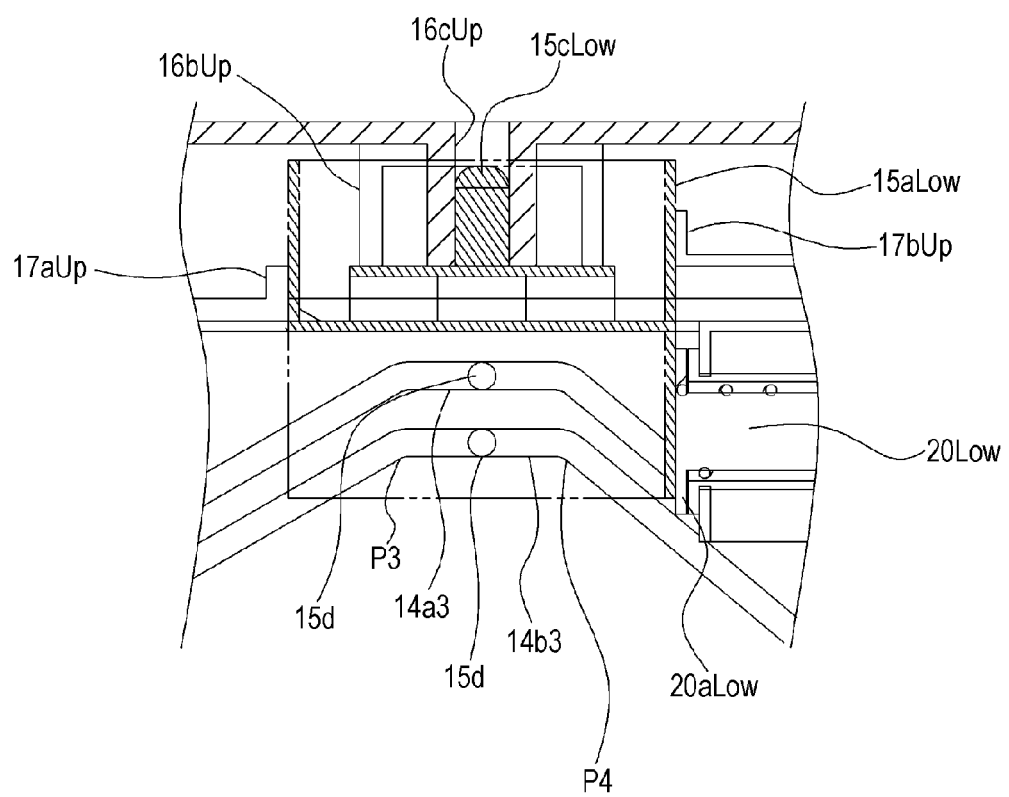
FIG. 14 is an enlarged explanatory view of a state when the socket connector and the plug connector are connected to each other.

Here, referring to FIG. 14, the functions of the front-side contact portion 17aUp and the back-side contact portion 17bUp are described. The plug connector 15Low is connected to the socket connector 16Up, disposed in the housing 12, using a space between the front-side contact portion 17aUp and the back-side contact portion 17bUp. Therefore, the plug connector 15Low and the socket connector 16Up are to be properly positioned. A proper clearance is provided between the front-side contact portion 17aUp and the plug connector 15low. A proper clearance is also provided between the back-side contact portion 17bUp and the plug connector 15Low. This makes it possible for the front-side contact portion 17aUp and the back-side contact portion 17bUp to vertically guide the plug connector 15Low.

When an Upper Enclosure is Removed

Next, the removal of an upper enclosure 11Up is described. The process of removing the upper enclosure 11Up is a process that is the reverse of the process illustrated from FIG. 8 to FIG. 13. That is, from the state illustrated in FIG. 13, the removal of the upper enclosure 11Up is started. When the removal is started, the back-side contact portion 17bUp comes into contact with the case 15a of the plug connector 15Low, and the plug connector 15Low moves towards the position P3 along the second horizontal portions 14a3 and 14b3. Then, when the enclosure 11Up is further pulled in the removal direction, the plug connector 15Low is pushed by the back-side contact portion 17bUp, and moves downward along the first inclined portions 14a2 and 14b2. This movement causes the socket connector 16Up and the plug 15Low to be disconnected from each other. It is eventually possible to reach the state illustrated in FIG. 8.

When a Lower Enclosure is Removed

Figure 15:
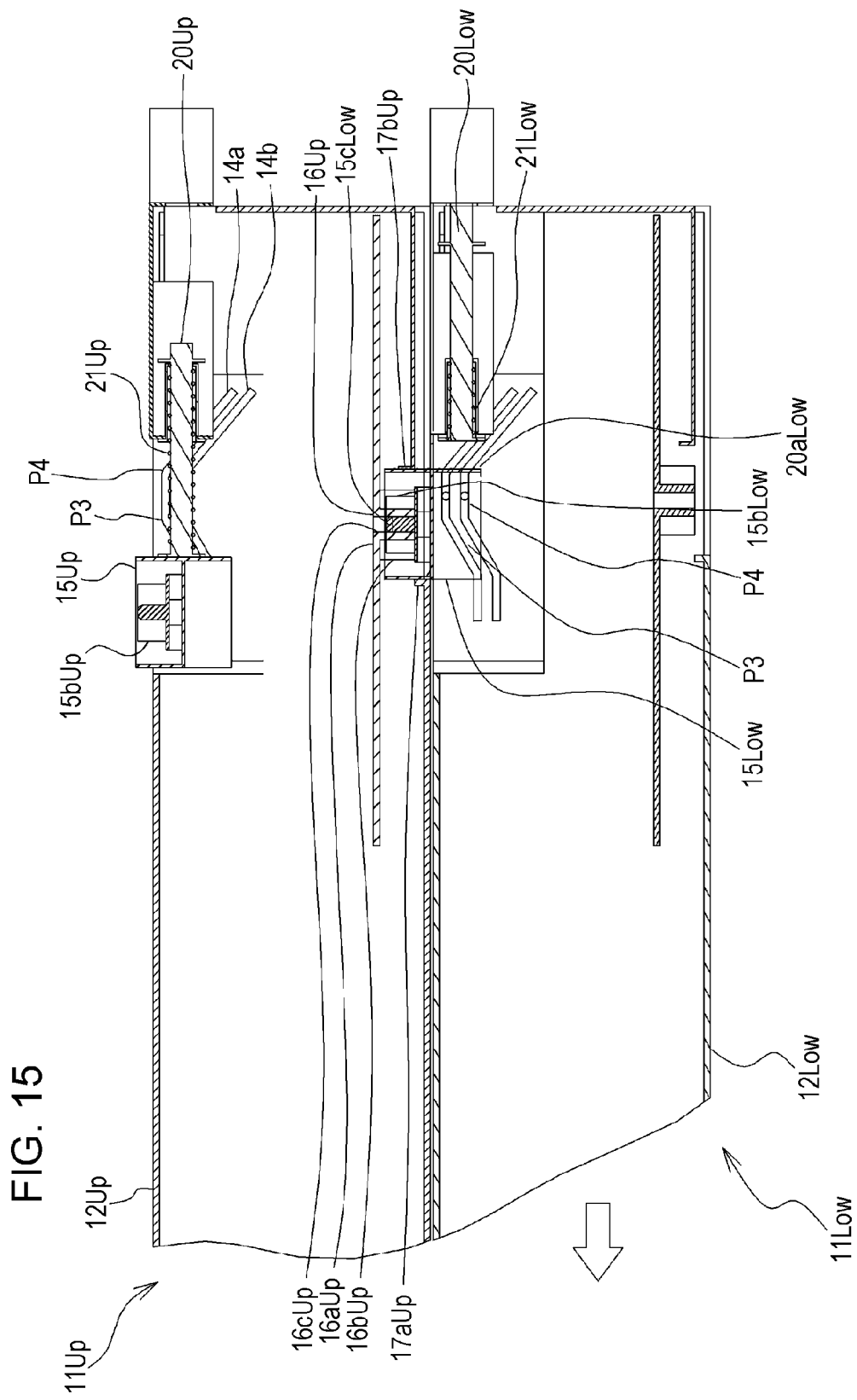
FIG. 15 is an explanatory view of a state directly after removal of the enclosure is started.

Next, of the installed upper enclosure 11Up and the installed lower enclosure 11Low, the removal of the lower enclosure 11Low is described. FIG. 15 is an explanatory view of a state directly after removal of the enclosure 11Low is started. By moving the lower enclosure 11Low towards the side towards which the enclosure 11Low is removed, the plug connector 15Low that is pushed by the front-side contact portion 17aUp of the enclosure 11Up moves horizontally up to the point P4 along the second horizontal portions 14a3 and 14b3. At this time, the plug connector 15Low and the socket 16Up are in a fitted state.

Figure 16:
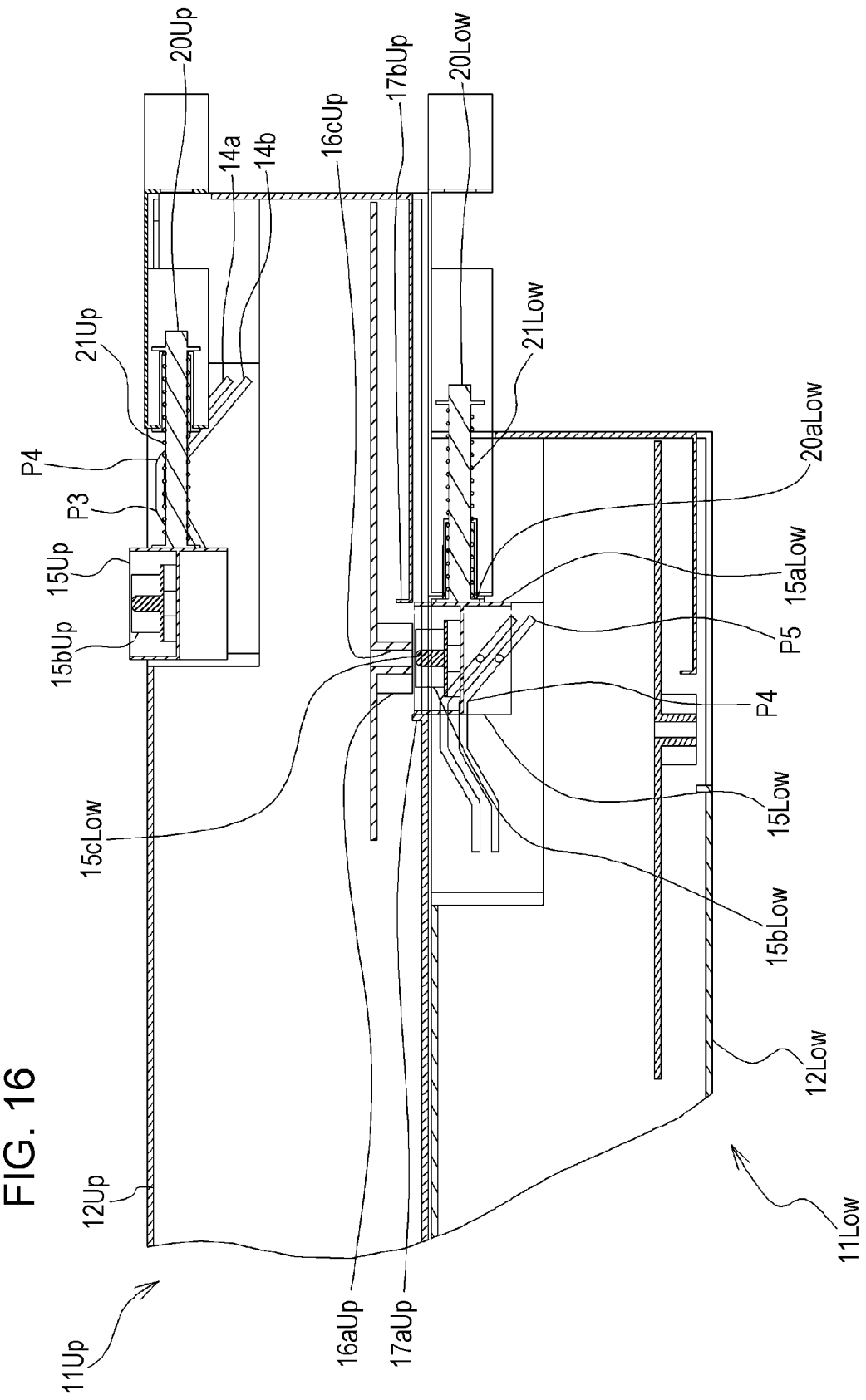
FIG. 16 is an explanatory view of a state in which the socket connector and the plug connector are brought out of the fitted state.

Next, FIG. 16 is an explanatory view of a state in which the socket connector 16Up and the plug connector 15Low are brought out of the fitted state. When the lower enclosure 11Low is further moved towards the side towards which the lower enclosure 11Low is removed, the plug connector 15Low that is pushed by the front-side contact portion 17aUp is moved from the point P4 towards the point P5 along the second inclined portions 14a4 and 14b4. This causes the plug connector 15Low to be lowered, so that the plug connector 15Low and the socket connector 16Up are brought out of the fitted state. As a result, the plug connector 15Low and the socket connector 16Up are disconnected from each other.

Figure 17:
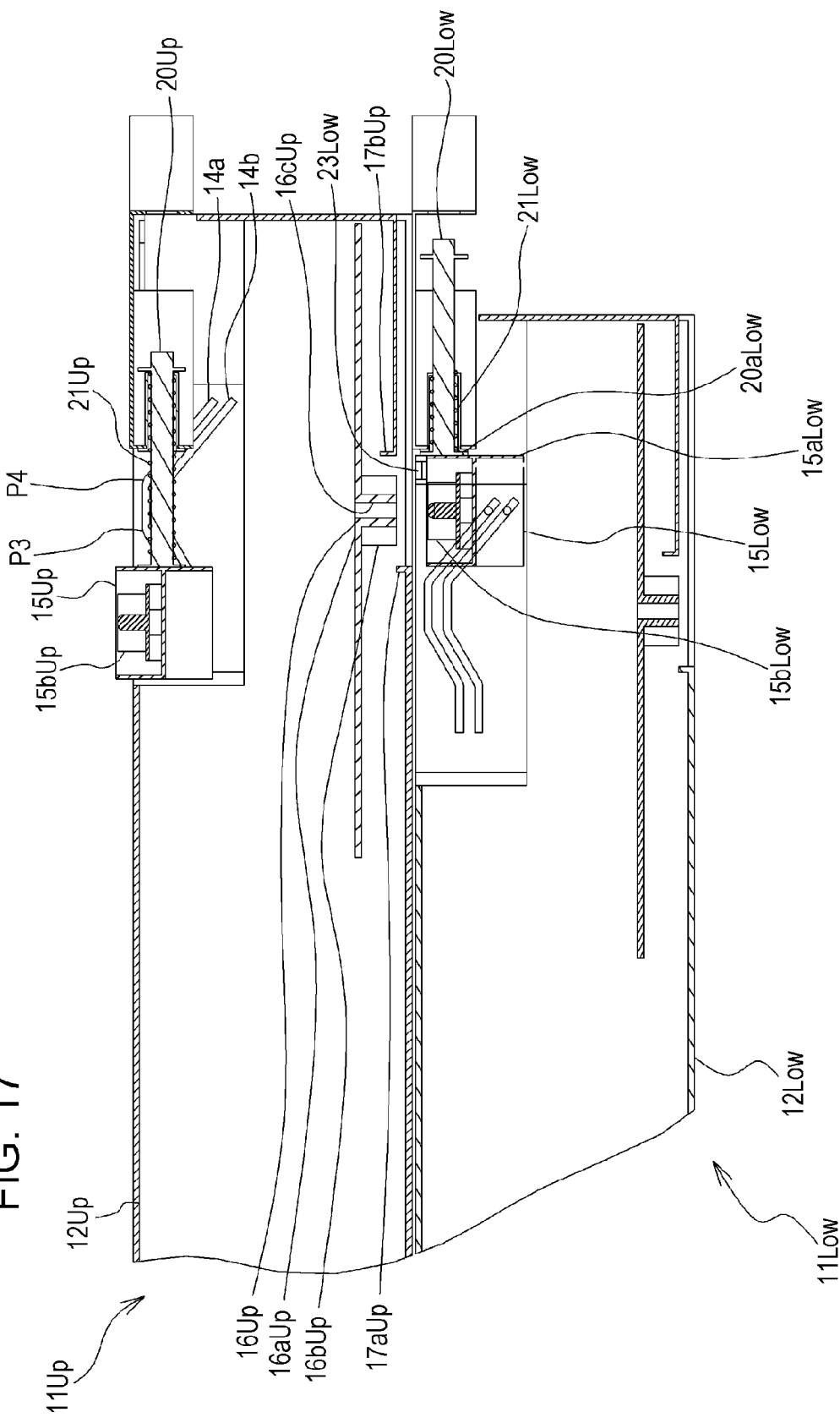
FIG. 17 is an explanatory view of a state in which the plug connector of the lower enclosure is accommodated below the holding member.
Figure 18A:
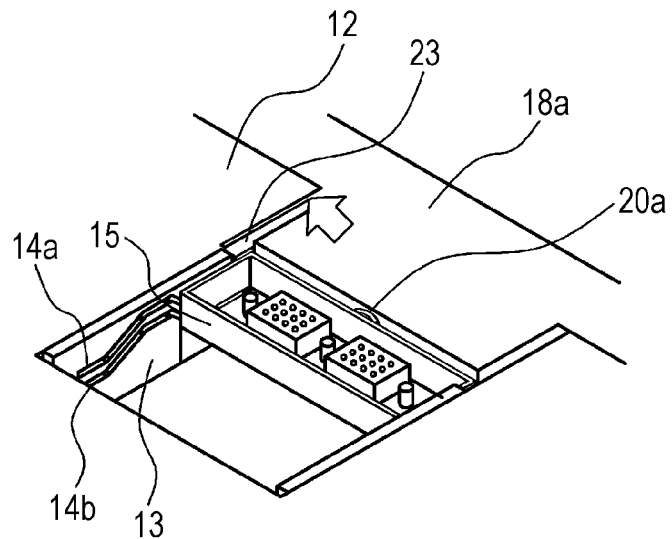
FIG. 18A is an explanatory view of the holding member in a state in which it is accommodated in the housing.
Figure 18B:
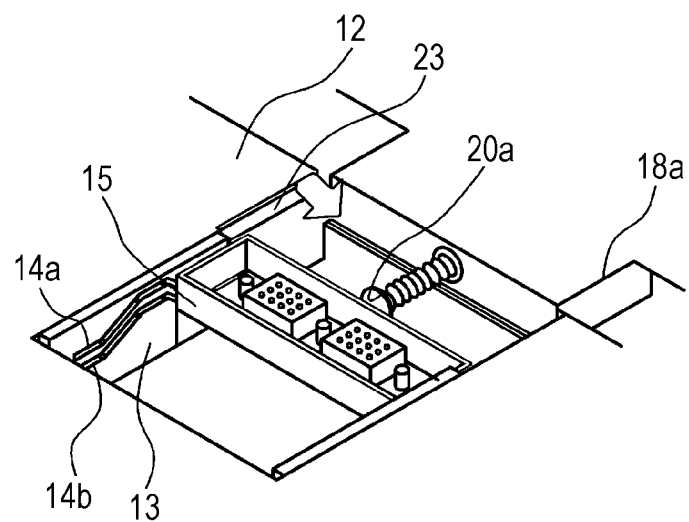
FIG. 18B is an explanatory view of the holding member in a state in which it extends out from the housing.

FIG. 17 is an explanatory view of a state in which the plug connector 15Low of the lower enclosure 11Low is accommodated below the holding member 23. When the lower enclosure 11Low is further moved towards the side towards which the lower enclosure 11Low is removed, the plug connector 15Low that is pushed by the front-side contact portion 17aUp moves to the point P5. The plug connector 15Low that has moved to the point P5 is set in a state in which the plug connector 15Low is completely accommodated in the connector accommodating section 13. When the plug connector 15 is in a state in which the plug connector 15 has moved to the point P5, the holding member 23 that is pushed by the protruding portion 18a is brought out of the pushed state. This causes the holding member 23 to extend out, so that the protruding of the plug connector 15Low is suppressed. This operation is described with reference to FIGS. 18A and 18B. FIG. 18A is an explanatory view of the holding member 23 in a state in which it is accommodated in the housing 12. FIG. 18B is an explanatory view of the holding member 23 in a state in which it extends out from the housing 12. As illustrated in FIG. 18A, when the holding member 23 is pushed by the protruding portion 18a, the holding member 23 is pushed into and accommodated in the housing 12. When the housing 12 of the enclosure 11 is removed from this state, the protruding portion 18a recedes relative to the housing 12. As a result, the holding member 23 that is pushed by the protruding portion 18a is brought out of the pushed state. When the holding member 23 that is pushed by the protruding portion 18a is brought out of the pushed state, urging force of the spring member 23a causes the holding member 23 to extend out to the connector accommodating section 13. At this time, the plug connector 15 is positioned below the holding member 23, so that the protruding of the plug connector 15 is suppressed. When the plug connector 15Low is accommodated in the connector accommodating section 13, the front-side contact portion 17aUp of the upper enclosure 11Up and the plug connector 15Low are brought out of the contact state.

Figure 19:
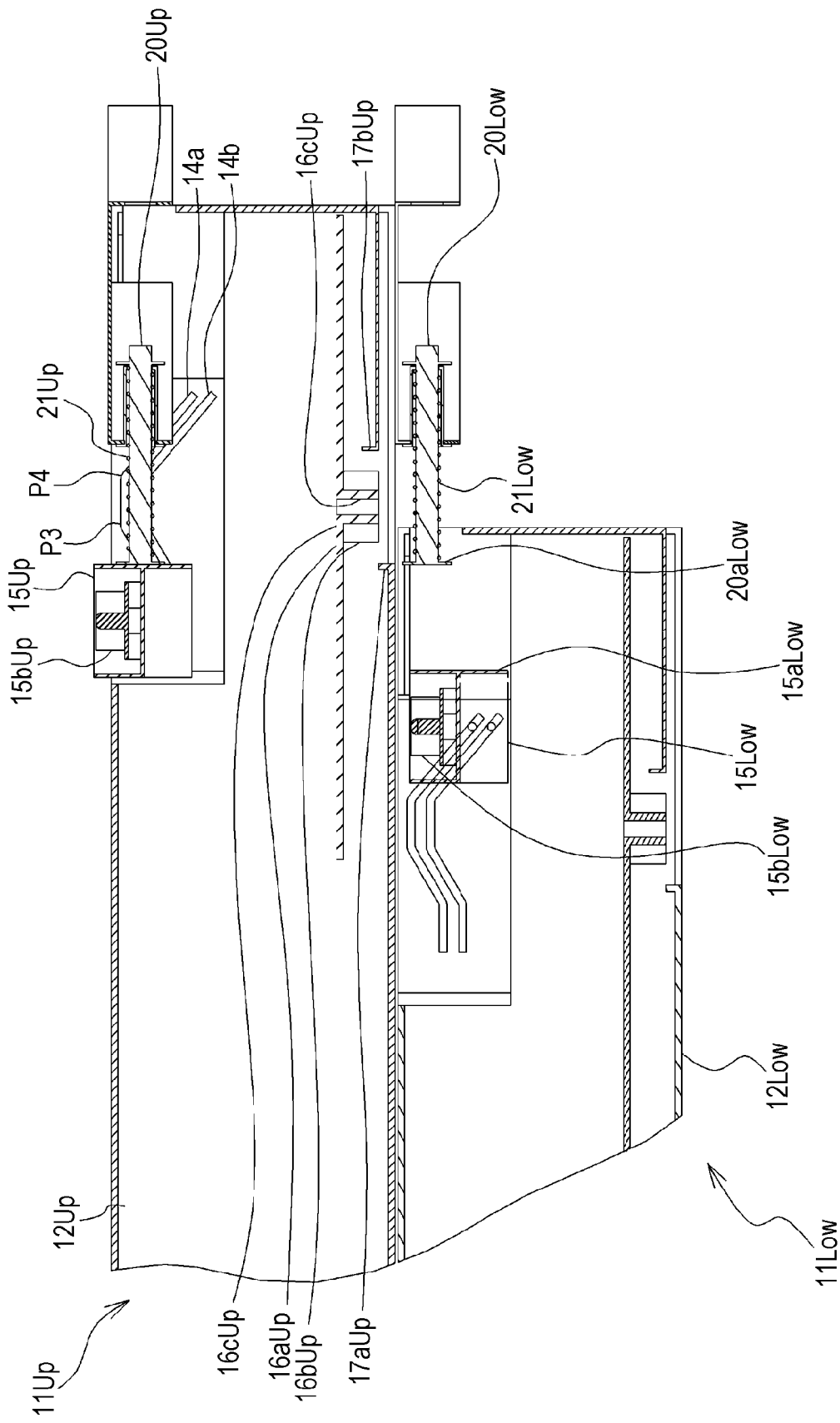
FIG. 19 is an explanatory view of a state in which the lower enclosure has been removed from the rack.

FIG. 19 is an explanatory view of a state in which the enclosure 11Low has been removed from the rack 10. Since, as mentioned above, the front-side contact portion 17aUp of the upper enclosure 11Up and the plug connector 15Low are brought out of the contact state, it is possible to easily remove the lower enclosure 11Low.

When an Enclosure is Installed at a Lower Side of an Installed Enclosure

Next, a case in which a lower enclosure 11Low is installed at a lower side of an enclosure 11Up installed in the rack 10 is described. Inserting and installing the lower enclosure 11Low is a process that is the reverse of the process illustrated from FIG. 15 to FIG. 19. That is, when the enclosure 11Low is inserted from the state illustrated in FIG. 19, the positioning member 20 that is urged by the coil spring 21 contacts a plug connector 15Low. In addition, the protruding portion 18a contacts and pushes the holding member 23. This causes the holding member 23 to be accommodated in the housing 12. When the enclosure 11Low is pushed further in from this state, the plug connector 15Low that has been pushed by the positioning member 20 moves along the second inclined portions 14a4 and 14b4 from the point P5 towards the point P4. This causes the plug connector 15Low to move upward. As a result, the plug connector 15Low is fitted to the socket connector 16Up. Then, by moving along the second inclined portions 14a4 and 14b4, the connection between the plug connector 15Low and the socket connector 16Up is completed.

The connection and disconnection of enclosures 11 when the enclosures 11 are inserted and removed are as described above. For example, in the case where enclosures 11 are inserted and removed when the enclosures 11 have been inserted into locations above and below target locations, the above-described operations are carried out in combination.

According to the embodiment, when an enclosure 11 is to be installed in the rack 10, it is possible to electrically connect, for example, signal wires and power wires between devices as a result of moving each part in response to each other. As a result, connection using an interface cable is not carried out. When connection using an interface cable is not carried out, it is possible to reduce the time taken for setting devices, and to reduce the number of locations where failures may occur. In addition, since an interface cable is not used, costs of the entire apparatus is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device available to be moved in an insertion direction into a supporting member to be stored in the supporting member in a state of being stacked on another electronic device, the electronic device comprising:

a first connector that is urged by an urging member, when the electronic device is in a state in which the electronic device is supported by the supporting member, in a direction same as a removal direction in which the electronic device is removed from the supporting member;

a housing that includes a first plate, a second plate, a connector housing disposed in the first plate, and a guide disposed at the second plate side, the first plate and the second plate being disposed side by side in a placing direction in which the electronic devices are placed one on top of another, the connector housing including the first connector so that the first connector is movable in directions same as an insertion direction and the removal direction, respectively, the insertion direction being in a direction in which the electronic device is inserted into the supporting member, the guide contacting a first connector of another electronic device disposed nearby the electronic device and the guide moving the first connector of the another electronic device in the insertion direction or the removal direction;

a second connector that is disposed at a position where the second connector is connectable to the first connector of the another electronic device, the first connector of the another electronic device facing an interior of the housing from the guide;

a holding member that causes the first connector of the electronic device to switch between a protruded state and a retreated state with respect to the connector housing in accordance with a relationship between a position of the housing and a position of the supporting member; and a guide rail that changes a position of the first connector of the electronic device in a placing direction in accordance with a position of the first connector in the connector housing in the insertion direction and the removal direction, the placing direction being a direction in which the electronic device is stored in the supporting member.

2. The electronic device according to claim 1,
wherein the guide includes a front-side contact portion and a back-side contact portion, the front-side contact portion being positioned at a front side of the supporting member in the insertion direction, the back-side contact portion being positioned at a back side of the supporting member in the insertion direction.

3. A connection structure of an electronic device that is moved to a supporting member in an insertion direction in which the electronic device is inserted into the supporting member and that is set in the supporting member while the electronic device and at least one other electronic device are placed one on top of another, the connection structure comprising:
  an electronic device that is positioned at a first side in a placing direction in which the electronic devices are placed one on top of another when the electronic device that is positioned at the first side is supported by the supporting member includes,
    a first connector that is urged in a direction that is the same as a removal direction in which the electronic device is removed from the supporting member, the first connector being urged by an urging member when the electronic device is in a state in which the electronic device is supported by the supporting member;
    a housing that includes a first plate, a second plate, and a connector accommodating section that is disposed in the first plate, the first plate and the second plate being disposed side by side in the placing direction, the connector accommodating section accommodating the first connector so that the first connector is movable in directions that are the same as the insertion direction and the removal direction;
    a holding member that causes the first connector of the electronic device to switch between a protruded state and a retreated state with respect to the connector accommodating section in accordance with a relationship between a position of the housing and a position of the supporting member; and
    a guide rail that changes a position of the first connector of the electronic device in the placing direction in accordance with a position of the first connector in the connector accommodating section in the insertion direction and the removal direction, and
  wherein an electronic device that is positioned at a second side, which is opposite to the first side, in the placing direction when the electronic device that is positioned at the second side is supported by the supporting member includes,
    a housing that includes a first plate, a second plate, and a guide that is disposed at the second plate, the first plate and the second plate being disposed side by side in the placing direction, the guide contacting the first connector of the electronic device that is placed and set at the first side and moving the first connector in the insertion direction and the removal direction; and
    a second connector that is disposed at a position where the second connector is connectable to the first connector of the electronic device that is positioned at the first side, the first connector of the electronic device that is positioned at the first side facing an interior of the housing of the electronic device that is positioned at the second side from the guide of the housing of the electronic device that is positioned at the second side.

4. The connection structure of an electronic device according to claim 3, wherein the urging member is supported by the supporting member.

5. The connection structure of an electronic device according to claim 3,
wherein the holding member is provided at the housing so as to freely protrude and retreat with respect to the connector accommodating section, and
the supporting member includes a protruding portion that contacts the holding member as the electronic device is inserted and that causes the holding member to retreat into the housing.

6. The connection structure of an electronic device according to claim 3,
wherein the guide includes a front-side contact portion and a back-side contact portion, the front-side contact portion being positioned at a front side of the supporting member in the insertion direction, the back-side contact portion being positioned at a back side of the supporting member in the insertion direction.

7. An electronic apparatus comprising:
a supporting member; and
an electronic device that is moved to a supporting member in an insertion direction in which the electronic device is inserted into the supporting member and that is set in the supporting member while the electronic device and at least one other electronic device are placed one on top of another, the electronic device including,
  a first connector that is urged in a direction that is the same as a removal direction in which the electronic device is removed from the supporting member, the first connector being urged by an urging member when the electronic device is in a state in which the electronic device is supported by the supporting member,
  a housing that includes a first plate, a second plate, a connector accommodating section that is disposed in the first plate, and a guide that is disposed at the second plate, the first plate and the second plate being disposed side by side in a placing direction in which the electronic devices are placed one on top of another, the connector accommodating section accommodating the first connector so that the first connector is movable in directions that are the same as the insertion direction and the removal direction, the guide contacting a first connector of another electronic device and moving the first connector of the another electronic device in the insertion direction and the removal direction, the another electronic device and the electronic device being placed and set one on top of another,
  a second connector that is disposed at a position where the second connector is connectable to the first connector of the another electronic device, the first connector of the another electronic device facing an interior of the housing from the guide,
  a holding member that causes the first connector of the electronic device to switch between a protruded state and a retreated state with respect to the connector accommodating section in accordance with a relationship between a position of the housing and a position of the supporting member, and
  a guide rail that changes a position of the first connector of the electronic device in a vertical direction in accordance with a position of the first connector in the connector accommodating section in the insertion direction and the removal direction.

\* \* \* \* \*